United States Patent
Sampath et al.

(10) Patent No.: US 10,388,468 B2
(45) Date of Patent: Aug. 20, 2019

(54) CONTACT MATERIAL FOR MEMS DEVICES

(71) Applicant: Innovative Micro Technology, Goleta, CA (US)

(72) Inventors: Suresh Sampath, Santa Barbara, CA (US); Christopher S. Gudeman, Lompoc, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 15/355,608

(22) Filed: Nov. 18, 2016

(65) Prior Publication Data
US 2018/0144879 A1  May 24, 2018

(51) Int. Cl.
*H01H 1/00* (2006.01)
*B81C 1/00* (2006.01)

(52) U.S. Cl.
CPC ....... *H01H 1/0036* (2013.01); *B81C 1/00095* (2013.01); *B81C 1/00166* (2013.01); *B81B 2201/018* (2013.01); *H01H 2001/0052* (2013.01); *H01H 2001/0057* (2013.01)

(58) Field of Classification Search
CPC .... C08J 5/12; C23C 18/31; C23F 1/16; C23F 1/32; C25D 3/12; C25D 3/48; C25D 7/00; H01H 1/06; H01H 1/021; H01H 11/04; H01H 2201/032; B32B 2255/06; B32B 2255/20; B32B 2255/205; B32B 2255/28; B32B 25/20; B32B 15/06; B32B 15/18; B32B 15/20; B32B 2307/202; B32B 2307/714; B32B 2307/75; B23B 2457/00
See application file for complete search history.

(56) References Cited

U.S. PATENT DOCUMENTS 6,812,814 B2 * 11/2004 Ma .................. H01H 59/0009
                                                    200/181
2007/0115082 A1 * 5/2007 Schirmer ............. H01H 1/0036
                                                    335/78

* cited by examiner

*Primary Examiner* — Anthony R Jimenez
(74) *Attorney, Agent, or Firm* — Jaquelin K. Spong

(57) ABSTRACT

A method for forming electrical contacts on a semiconductor substrate is disclosed. The method includes forming a first metal layer over the substrate, and forming a layer of a second metal oxide by sputter deposition of a second metal in an oxygen environment. In some embodiments, the second metal oxide may be ruthenium dioxide, and the first metal layer may be gold, copper, platinum, silver or aluminum.

20 Claims, 5 Drawing Sheets

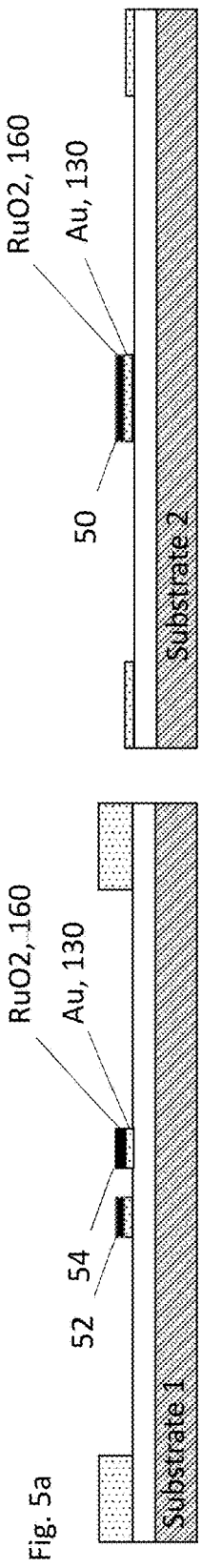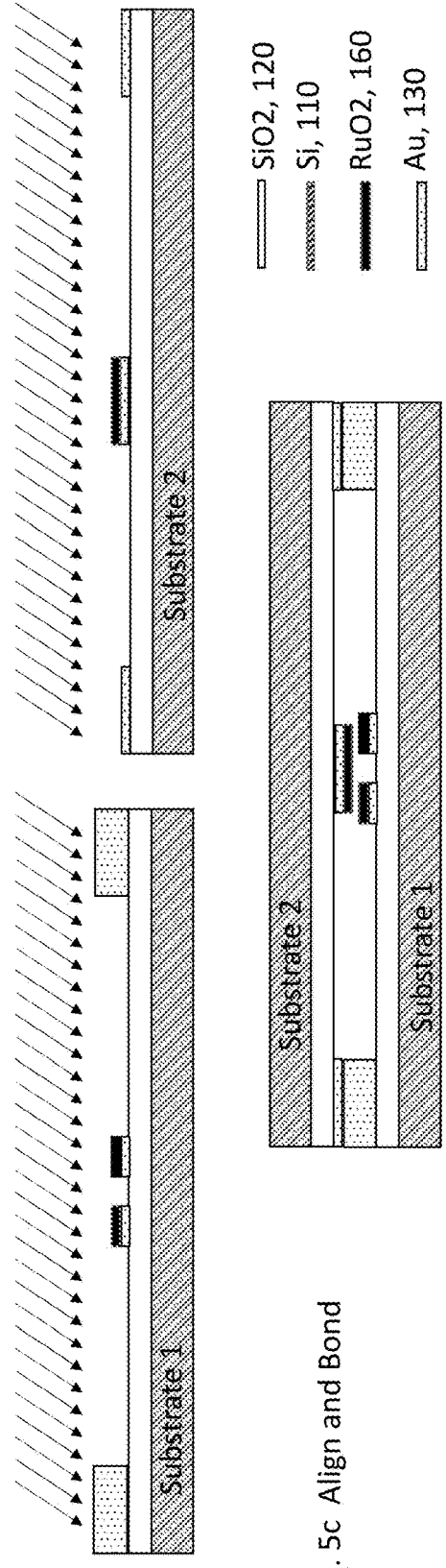

CONTACT MATERIAL FOR MEMS DEVICES

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a system and method for forming a contact material for a MEMS device.

Microelectromechanical systems are devices often having moveable components which are manufactured using lithographic fabrication processes developed for producing semiconductor electronic devices. Because the manufacturing processes are lithographic, MEMS devices may be made in very small sizes, and in large quantities. MEMS techniques have been used to manufacture a wide variety of sensors and actuators, such as accelerometers and electrostatic cantilevers.

MEMS techniques have also been used to manufacture electrical relays or switches of small size, generally using an electrostatic actuation means to activate the switch. MEMS devices often make use of silicon-on-insulator (SOI) wafers, which are a relatively thick silicon "handle" wafer with a thin silicon dioxide insulating layer, followed by a relatively thin silicon "device" layer. In the MEMS devices, a thin cantilevered beam of silicon may be etched into the silicon device layer, and a cavity is created adjacent to the thin beam, typically by etching the thin silicon dioxide layer below it to allow for the electrostatic deflection of the beam. Electrodes provided above or below the beam may provide the voltage potential which produces the attractive (or repulsive) force to the cantilevered beam, causing it to deflect within the cavity.

MEMS switches may fail if modest voltage is present across the open contacts when the switch is closed or opened. This is referred to as "Hot Switching". This occurs because the contacts of a switch are microscopically rough. The true area of solid-solid interaction between the contacts is thus limited to that area at the tip of the tallest asperities. This true area of contact is typically much less than 1 $um^2$. If voltage is present on the contacts during this brief time interval when the contact area is vanishingly small, immense heating of the asperity peaks that carry the instantaneous current spike can occur. This often exceeds the melting point of the contact materials. On the other hand, a very smooth surface may give rise to static friction (stiction) which may may it difficult or impossible to open the switch.

Previous attempts to improve reliability include chemical mechanical polishing (CMP) of materials. This will often contaminate the surface, which must remain atomically clean in order to provide low contact resistance. Roughness can also be reduced by tediously reducing the roughness of each of the layers in a tin film stack, such as the oxide/Ti/TiW/Au/Ru/RuO2 stack that is typically used in MEMS switches. Because these stacks are complex and multilayered, this is a time consuming and ad hoc process.

The contact resistance (CR) can increase or become variable with increasing open/close cycles, or the contacts can weld together, thus preventing the switch from opening. Generally speaking, the contacts tend to be unreliable. To combat this a vast range of contacting materials have been studied. These include mainly pure metals (Au, Mo, Ru, W, Ni, Pt, Pd), but alloys (AuPd, AuNi) and oxides (RuO2) are commonly found as well. Additionally, stacks of thin layers may be formed in various thickness ranges, where the various layers each provide a different function, such as adhesion, metal-metal diffusion barrier, thermal and electrical conductivity enhancement, and hardness. Constraints in the process and design often limit the effectiveness or extent of enhancement provided by these complex stacks of films. For instance, a thin oxide on the contacting surface of a Ru metal film can greatly improve the hardness at the contacts, and thus improve the reliability. However process methods to grow thin oxides on this metal are limited to 10-20 nm thickness. Over many millions of open/closure cycles, this extremely thin film can wear away completely.

SUMMARY

We describe here a method for forming a hard, robust electrical contact for a switch or other device, especially a MEMS device. The method includes forming a first metal layer on a substrate, and forming a layer of a second metal oxide by sputter deposition of a second metal target in an environment of oxygen to form the second metal oxide layer over the first metal layer. Using this technique, the oxide of the second metal is formed upon deposition, rather than by allowing a metal layer to oxidize at its exposed surface. Much thicker oxide layers are possible using this method.

In one embodiment, a ruthenium metal is sputter deposited over a layer of gold. The sputtering may take place in an ambient oxygen environment, which oxidizes the ruthenium metal as it is deposited. Using this technique, hard, robust and reliable $RuO_2$ layers can be made which are much thicker, on the order of 60 to 120 nm. This is far thicker than the prior art thickness of on the order of 20 nm, allowing the device to perform reliably over a much longer lifetime.

Electrical contacts may be made using this technique which are robust and reliable. MEMS switches using a movable, cantilevered beam may be fabricated with a thick layer of $RuO_2$ on each contact surface. A dual substrate MEMS switch may also be made using these methods. These methods and devices are described in detail below.

Accordingly, making hard contact, very small (MEMS) switches has been an elusive goal, wherein the switch reliably opens and closes over the lifetime of the device.

BRIEF DESCRIPTION OF THE DRAWINGS

Various exemplary details are described with reference to the following figures, wherein:

FIG. 5a is a cross sectional view of a third exemplary embodiment using two separate substrates with a layer of ruthenium dioxide formed thereon using the novel method, after a first fabrication step; FIG. 5b is a cross sectional view of a third exemplary embodiment using two separate substrates with a layer of ruthenium dioxide formed thereon using the novel method, after a second fabrication step; FIG. 5c is a cross sectional view of a third exemplary embodiment using two separate substrates with a layer of ruthenium dioxide formed thereon using the novel method, after a third fabrication step, wherein the two substrates are bonded together.

It should be understood that the drawings are not necessarily to scale, and that like numbers may refer to like features.

DETAILED DESCRIPTION

A multilayer film stack has been shown to be effective in improving lifetime to greater than 1 billion cycles. The multilayer stack may start with a layer of Au, roughly 1-5 um in thickness. On this gold layer, a 100 nm thick layer of Ru metal may be deposited. Finally the surface of the Ru is oxidized in an $O_2$ atmosphere at modest temperatures (250-350 C), forming a very thin layer (10-20 nm) of RuO2. The oxide layer may form the contact surface, and may be formed before the sacrificial layer is deposited. Accordingly, the Ru oxide may form the first contact, but it cannot be formed on the surface for the second contact, because the Ru is deposited directly on the sacrificial layer, and so there are no exposed surfaces to oxidize.

Therefore, the oxides are generally formed after release (when the sacrificial layer is etched away). The high temperature process required can often cause warpage of the MEMS structure in the released device. Controlling the oxidation process is also difficult in that contaminants left behind by the sacrificial layer can impede the growth of an oxide that is uniform in thickness and stoichiometry. Finally all known literature indicates that the contact resistance of these contacts is 5-10 ohms, which requires that the switch design incorporate several contacts in parallel to achieve a contact resistance on the order of 1-2 ohm. A low contact resistance electrode is generally required in many applications, such as band switching in mobile phones, tester reconfiguration in automated electronics test equipment, ultrasonic transducers, and in-home appliance control circuitry.

A significantly thicker conductive oxide layer on a very low resistance underlayer is needed to provide long life. We describe here an effective stack of layers with a thicker, more robust oxide layer, and a method for their fabrication.

A method is described for forming a hard, robust electrical contact for a microfabricated MEMS device. The method includes forming a first metal layer on a substrate, and forming a layer of a second metal oxide by sputter deposition of a second metal target in an environment of oxygen to form the second metal oxide layer over the first metal layer. The second metal oxide layer may form a tough, yet highly conductive contact for the metal layer below, increasing its durability and robustness. In one exemplary embodiment, the first metal layer is gold, and the metal oxide is $RuO_2$. The techniques may be used to form a single contact electrode (FIG. 1), or a multilayer stack with a sacrificial layer separating two contact electrodes (FIG. 4) or on a dual substrate switch (FIG. 5), for example.

Figure 1:
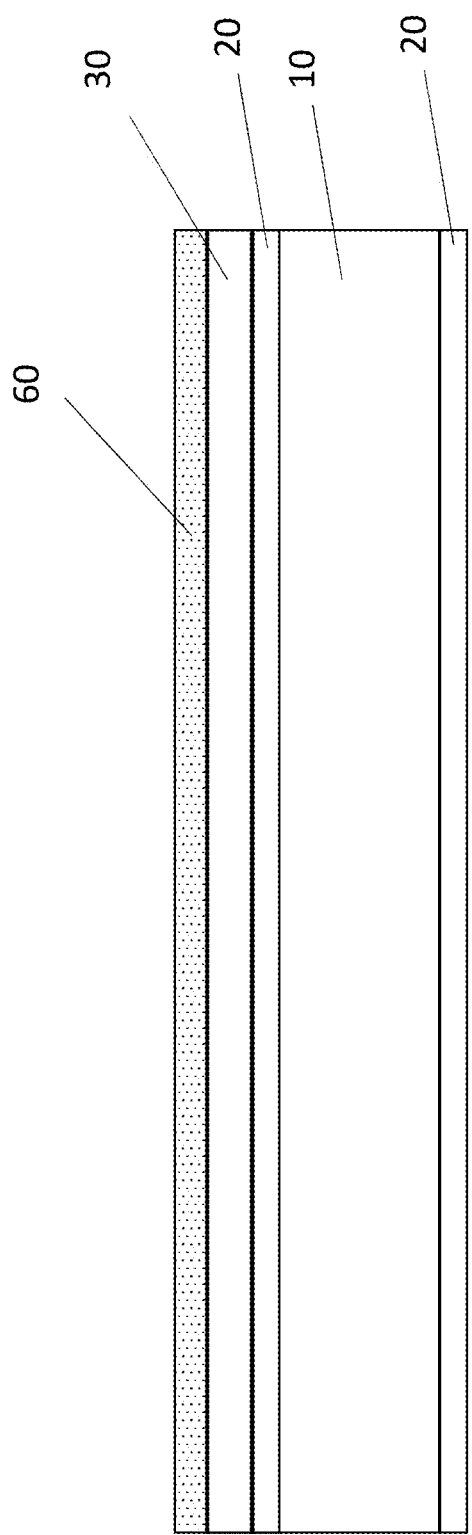
FIG. 1 is a cross sectional view of an exemplary substrate with a layer of low resistivity oxide formed thereon.

FIG. 1 shows a basic exemplary substrate with a single contact electrode. The structure may comprise silicon 10 with a layer of silicon dioxide 20 formed thereon. The silicon dioxide 20 may be the native oxide or may be a thermal oxide grown in a humid oven. A metal layer 30 may then be deposited over the silicon dioxide 20. The metal layer 30 may be 0.5-5.0 um thick, for example. The metal may be gold (Au), copper (Cu), aluminum (Al), platinum (Pt) or silver (Ag), for example. The layer may be plated, or deposited by sputter deposition, or chemical or plasma deposition, for example.

Figure 2:
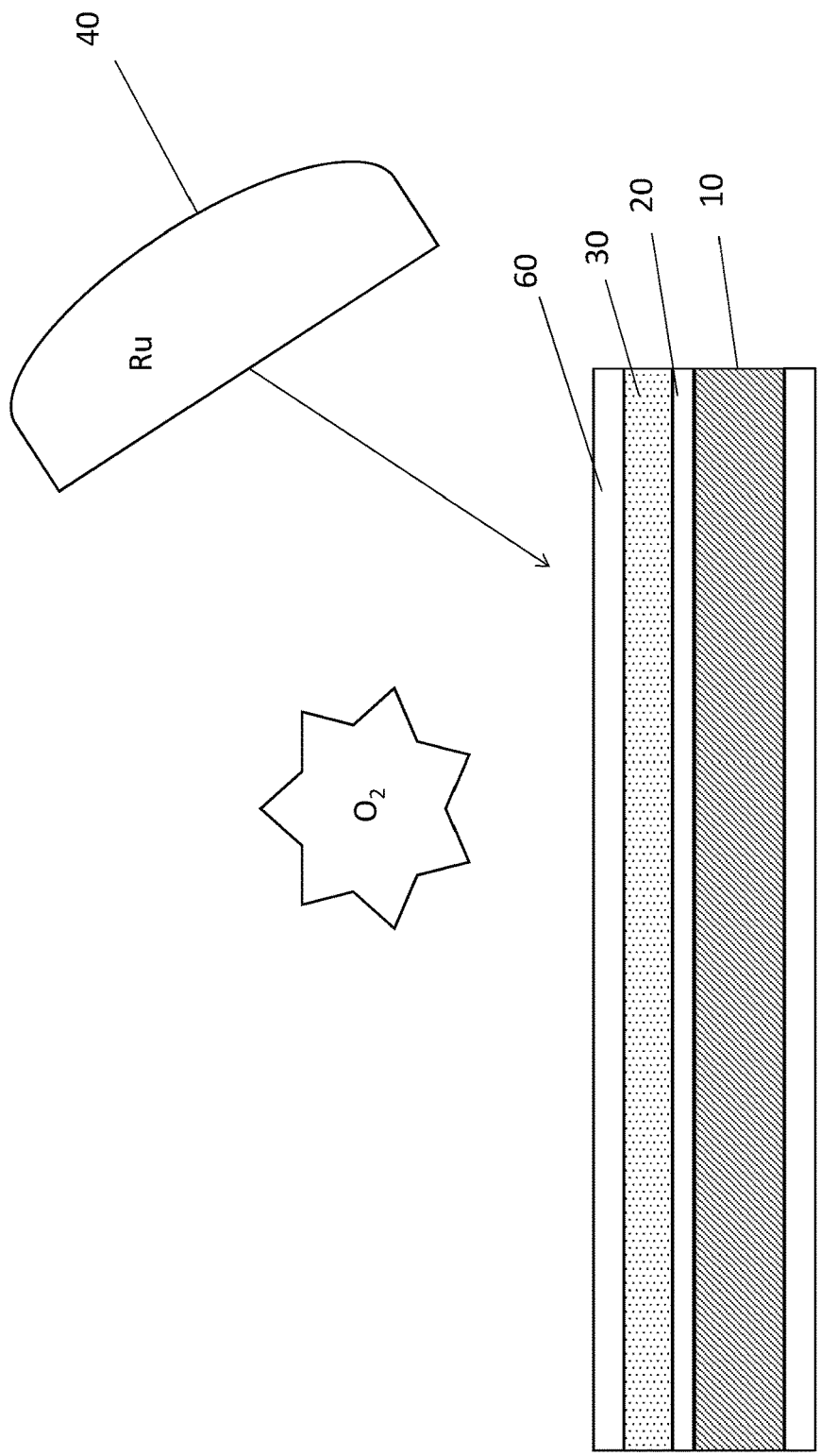
FIG. 2 is an illustration of an exemplary system which may be used to fabricate the structure shown in FIG. 1.

After the metal layer 30, a layer 60 of a hard, conductive metal oxide may be formed. The metal oxide may be ruthenium dioxide $RuO_2$. A system which may be used to form the metal oxide $RuO_2$ is illustrated in FIG. 2. This oxide layer 60 may be sputter deposited using a pure metal target 40 in a background of O2 gas. Accordingly, the metal target may be a pure metal Ru target, which deposits a ruthenium layer over the first metal (gold) layer. The Ru may be oxidized as it is deposited. The oxidation occurs in an $O_2$ environment, which forms a layer of ruthenium dioxide $RuO_2$ layer 60 over the metal layer 30 over the silicon dioxide 20 over a silicon substrate 10.

More generally, the structure may comprise a first layer of a very low resistivity metal, e.g. Au or Cu, followed by a second layer of relatively thick (60-120 nm) of metal oxide such as $RuO_2$, which is deposited as $RuO_2$ by sputtering Ru metal from a pure Ru target 40 while providing a low background pressure of O2 during deposition. A partial pressure of 0.5-10 mTorr of $O_2$ is suitable for the reactive sputtering process. The compound $RuO_2$, which, although an oxide, has a remarkably low resistivity of ~30-50 micro-Ohm-cm. It also has significant mechanical hardness, making it an attractive material to form an electrical contact for a small MEMS-type switch. The thick, hard, conductive $RuO_2$ contact material provides for a long life, consistent performance and high reliability.

The process can be used in designs with or without a sacrificial layer. A first exemplary embodiment uses a sacrificial layer in the processing. This embodiment is a structure with two electrical contacts, one stationary and one on the end of a movable cantilevered beam. The prior art approach to such a structure is shown in FIG. 3, and the approach using this novel method is shown in FIG. 4. In another embodiment, the two contacts are fabricated on separate substrates, such as in the case of a dual substrate switch, the contact resistance is roughly 1-2 ohms. This embodiment is illustrated in FIG. 5.

In order to make clear the difference from the prior art of the process disclosed here and its implications, a prior art two-electrode, cantilevered structure is shown in FIG. 3.

The multilayer stack may start with a layer of Au, roughly 1-5 um in thickness. On this gold layer, a 100 nm thick layer 142 of Ru metal may be deposited. At this point, the surface of the Ru could be oxidized in an $O_2$ atmosphere at modest temperatures (250-350 C), forming a very thin layer (10-20 nm) of $RuO_2$. A first oxide layer may form the first contact surface, and may be formed before the sacrificial layer is deposited.

On top of the Ru layer 142, however, a sacrificial layer 150 may be formed. It will be removed subsequently to free the upper electrode 134 and 144 which are deposited on top of the sacrificial layer 150. However, although the $RuO_2$ may form the first contact, it cannot be formed for the second contact, because the second Ru layer 144 is deposited on the sacrificial layer, and then covered with the second layer of gold 134. Accordingly, there is no exposed surface to oxidize until the sacrificial layer is removed. Therefore, the oxides are generally formed after release (when the sacrificial layer is etched away), as described next.

Figure 3A:
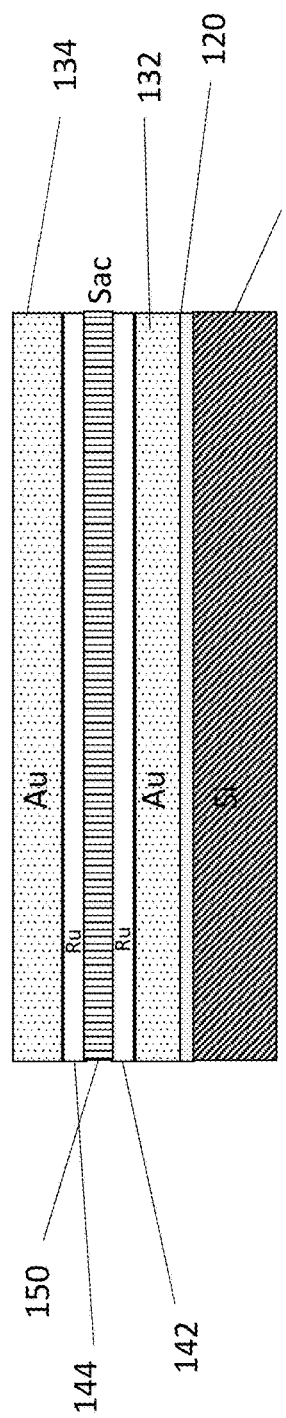
FIG. 3*a* is a cross sectional view of a prior art substrate with a layer of ruthenium dioxide formed thereon, after a first fabrication step.

The structure may have an electrically conductive layer on the bottom 132 and a movable electrically conductive layer 134 on the top. The top and the bottom electrically conductive layers 132, 134 may be separated by the sacrificial layer 150. In FIG. 3a, the structure is fabricated as a multilayer stack including a silicon wafer 110, a layer of silicon dioxide 120 formed thereon, two layers of gold (Au) 132, 134, and two layers of metallic ruthenium 142, 144. The ruthenium layers 142, 144 may eventually form the contacts, and are initially separated by a sacrificial layer 150 as shown.

Figure 3B:
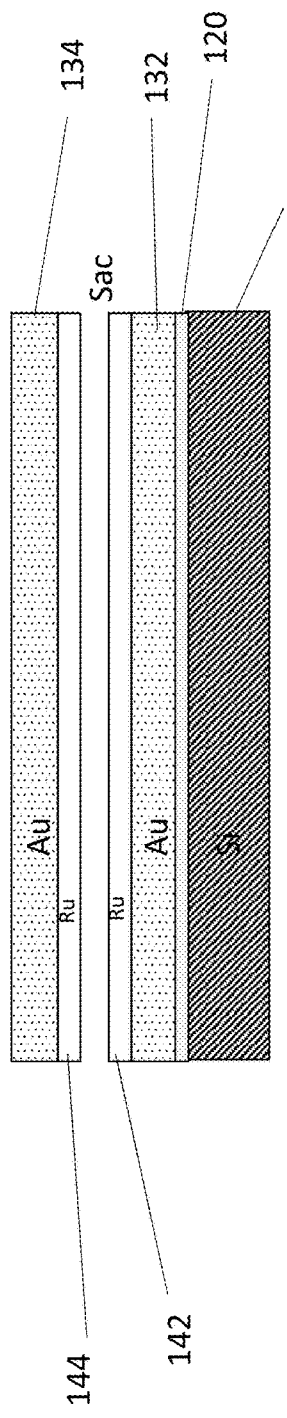
FIG. 3*b* is a cross sectional view of a prior art substrate with a layer of ruthenium dioxide formed thereon, after a second fabrication step.
Figure 3C:
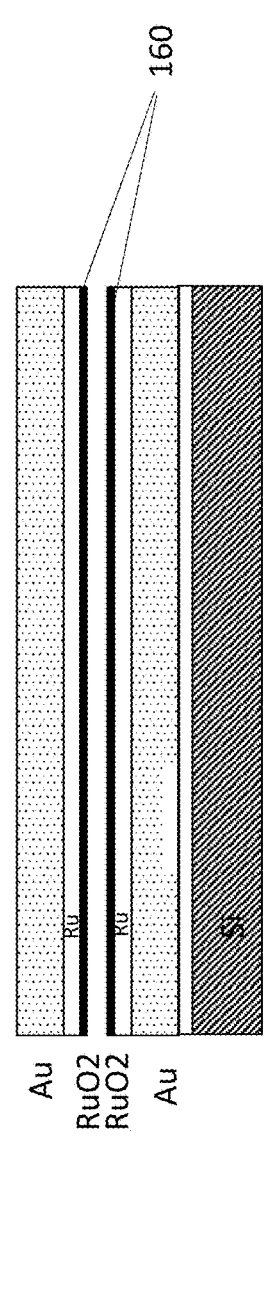
FIG. 3*c* is a cross sectional view of a prior art substrate with a layer of ruthenium dioxide formed thereon, after a third fabrication step.

In order to free the contact so that the switch may open and close, the sacrificial layer 150 may be removed (FIG. 3b). This exposes the ruthenium metal 142, 144 which is then oxidized to form a thin layer of ruthenium dioxide 160 which passivates the remaining ruthenium 142, 144. The final condition of the structure is shown in FIG. 3c.

Figures 4A, 4B:
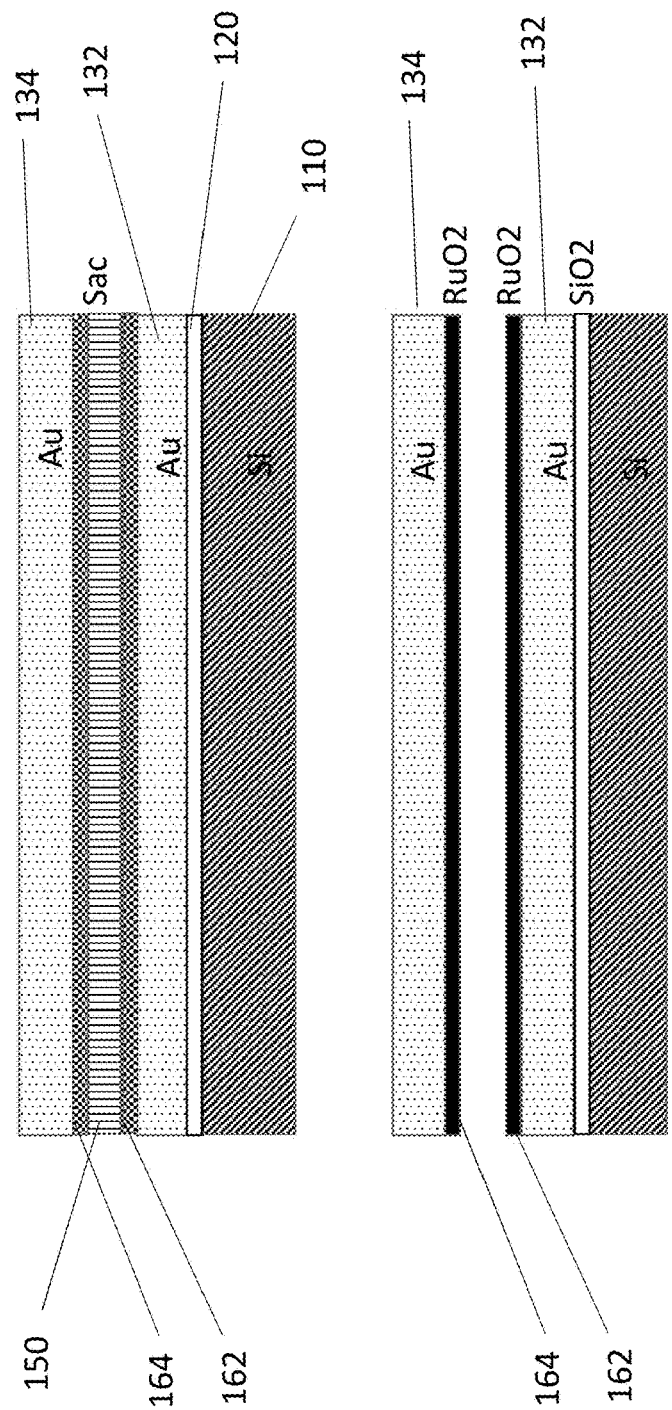
FIG. 4a is a cross sectional view of a second exemplary embodiment of two $RuO_2$ contacts formed on a substrate using this method after a first fabrication step.
FIG. 4b is a cross sectional view of a second exemplary embodiment of two $RuO_2$ contacts formed on a substrate using this method after a second fabrication step.

In contrast to the prior art approach, the novel process is illustrated in FIG. 4 on a similar structure. As shown in FIG. 4a, the structure is again fabricated as a multilayer stack including a silicon wafer 110, a layer of silicon dioxide 120 formed thereon, two layers of gold (Au) 130, and two layers of ruthenium dioxide 162, 164. However, in this case, the ruthenium dioxide is deposited directly using the process described above, sputter deposition of ruthenium in an oxygen environment. Using this process, the ruthenium dioxide layers 162, 164 may be quite thick, on the order of 60 to 120 nm.

To complete the operational switch, the sacrificial layer may be removed, by for example, a wet etch. The removal of the sacrificial layer 150 frees the upper electrode 164, 134, allowing it to move.

According to this method, the thick layers of $RuO_2$ are deposited serially as the stack is constructed, rather than at the end when the sacrificial layer is removed, exposing the Ru surfaces and oxidizing them. This allows much thicker metal oxide layers to be formed, because they are deposited directly rather than oxidized at this surface. This surface oxidation will yield only a thin layer of oxide because the oxide will passivate the surface, so the growth of the oxide is generally self-limiting, and on the order of 20 nm or less.

Another exemplary embodiment is illustrated in FIG. 5a-5c, which shows a dual substrate MEMS switch in fabrication. This architecture is described in U.S. Pat. No. 7,528,691 issued May 5, 2009. Additional description of manufacturing methods and use for this switch may be found in U.S. Pat. No. 7,893,798 issued Feb. 22, 2011 and U.S. Pat. No. 7,864,006, issued Jan. 11, 2014. These patents are incorporated by reference in their entirety.

In FIG. 5a, the multilayer stacks are fabricated on two separate substrates, substrate 1 and substrate 2. As before, each substrate includes a silicon wafer 110, and a layer of silicon dioxide 120 formed thereon, a layer of metal, e.g. gold (Au) 130, and a layer of ruthenium dioxide 160. The layers are deposited using the techniques described above. The additional gold features may be bondline structures which will be used to attach substrate 2 to substrate 1, using a gold-gold thermocompression bond, for example.

As before, relatively thick layers 130 of a first metal (gold) are deposited by sputter deposition for example. Then, the ruthenium dioxide layers 160 are deposited directly using the process described above, sputter deposition of ruthenium in an oxygen environment. Thus the $RuO_2$ layers 160 are formed directly, rather than by later oxidation of a layer of metallic ruthenium.

As shown in FIG. 5a, substrate 1 may support the two electrodes, the incoming 52 and outgoing 54 electrodes. The "gate substrate" substrate 2 may support the movable beam 50 which provides an electrical short between the incoming and outgoing electrodes, thus closing the switch.

After fabricating the layers of the first metal (gold) 130 and $RuO_2$ 160 as shown in FIG. 5a, the surface of the multilayer stack may be cleaned as shown in FIG. 5b. The cleaning technique may be exposure to an ionizing plasma, or sputter/etching a thin layer off the top of the stack. The final device or switch is formed by bonding substrate 1 to substrate 2, such that the movable beam 50 spans the input 52 and output 54 electrodes. The completed switch is shown schematically in FIG. 5c.

Accordingly, a method is described for forming an electrical contact for a switch, comprising forming a first metal layer on a substrate, and forming a layer of a second metal oxide by sputter deposition of a second metal target in an environment of oxygen to form the second metal oxide layer over the first metal layer. The substrate may be a silicon substrate, and the first metal may be gold, copper, aluminum or silver, for example. The second metal may be ruthenium. The first metal layer may be about 0.5-5.0 um thick, and the metal oxide layer may be ruthenium dioxide. The ruthenium dioxide metal oxide layer may be about 100 nm thick, and more generally between about 60 nm and 120 nm thick. The ruthenium dioxide may be formed by sputter deposition of a ruthenium target in a low pressure oxygen environment. The oxygen environment may have an oxygen partial pressure of about 0.5 mTorr to about 10 mTorr.

In other embodiments, the first metal may be aluminum. The switch may be a MEMS switch and the method may include a sacrificial layer.

Some embodiments may make use of a sacrificial layer. The sacrificial layer, such as polyimide, photoresist, or Cu, may be next deposited on the second metal oxide layer. A third metal oxide layer may then be deposited on the sacrificial layer. The stack of layers is then completed with a $4^{th}$ low resistivity metal layer such as Au in the range of 0.5-5.0 um thick. The sacrificial layer is then removed, thus creating a movable cantilever beam comprised of the $3^{rd}$ metal oxide layer and the $4^{th}$ metal layer. This embodiment is illustrated in FIG. 4a-4c.

In this method disclosed, the switch may be a MEMS switch. Further, the switch may be a dual substrate MEMS switch. The dual substrate switch may include a first substrate which supports an incoming and an outgoing electrode, and a second substrate supports a movable gate electrode. The incoming electrode, outgoing electrode and movable electrode may each comprises a first metal layer and a second metal oxide layer deposited over the metal layer. The second metal oxide layer may comprise $RuO_2$. In this embodiment, the first metal layer may be a layer of gold, between about 0.5-5.0 um thick.

The structure made by the method may comprise: an electrical contact for a switch, including a first metal layer on a substrate and a second layer of a second metal oxide, wherein the second metal oxide does not contain the first metal, and is disposed directly adjacent and in contact with the first metal layer. It should be understood that "the second metal oxide does not contain the first metal" means that the metal oxide, for example, MeO$_2$, the oxide of the metal "Me," Me is not the same as the first metal. For example, if the MeO$_2$ is formed over a layer of silver Ag, Me cannot be silver Ag. So if the first metal is silver, Ag, the oxide cannot be Ag$_2$O, but must be some other metal oxide such as Al$_2$O$_3$.

The substrate may be a silicon substrate, and the first metal may be at least one of gold, copper, platinum, silver and aluminum, wherein the second metal may be ruthenium and the metal oxide layer may be ruthenium dioxide. The first metal layer may be between about 0.5-5.0 um thick. The ruthenium dioxide may be formed by sputter deposition of a ruthenium target in a low pressure oxygen environment. The oxygen environment may have an oxygen partial pressure of about 0.5 mTorr to about 10 mTorr. The ruthenium dioxide may have a thickness of between about 60 nm and about 120 nm.

The switch may be a MEMS switch or a dual substrate MEMS switch. The dual substrate MEMS switch may include a first substrate, which supports and incoming and an outgoing electrode, and a second substrate, which supports a movable gate electrode. The incoming electrode, outgoing electrode and movable electrode may each comprise a first metal layer and a second metal oxide layer deposited over the metal layer.

Accordingly, it should be understood while much of the foregoing description is directed to a particular metal oxide, RuO$_2$, that the method is broadly application to other metal oxides, such as Al$_2$O$_3$. Accordingly, other metal oxides may be deposited by sputter deposition of a pure metal target in an oxygen environment, such that the oxide is formed as it is deposited. Using this method, much thicker metal oxides may be fabricated, because the bulk metal is not passivated by an oxide coating in general.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A method for forming an electrical contact for a switch, comprising:
    forming a first layer of a first metal on a substrate; and
    forming a second layer of an oxide of a second metal by sputter deposition of a second metal target in an environment of oxygen to form a second metal oxide layer over the first metal layer, wherein the second metal oxide does not contain the first metal, and wherein the second metal is ruthenium and the metal oxide layer is ruthenium dioxide.

2. The method of claim 1, wherein the substrate is a silicon substrate, and wherein the first metal is at least one of gold, copper, platinum, silver and aluminum.

3. The method of claim 1, wherein the first metal layer is between about 0.5-5.0 um thick.

4. The method of claim 1, wherein the ruthenium dioxide is formed by sputter deposition of a ruthenium target in a low pressure oxygen environment.

5. The method of claim 1, wherein the switch is a MEMS switch.

6. The method of claim 1, wherein the oxygen environment has an oxygen partial pressure of about 0.5 mTorr to about 10 mTorr.

7. A method for forming an electrical contact for a switch, comprising:
    forming a first-layer of a first metal on a substrate; and
    forming a second layer of an oxide of a second metal by sputter deposition of a second metal target in an environment of oxygen to form a second metal oxide layer over the first metal layer, wherein the second metal oxide does not contain the first metal,
    wherein the metal oxide is ruthenium dioxide at a thickness of between about 60 nm and about 120 nm.

8. The method of claim 1, wherein the switch is a dual substrate MEMS switch.

9. The method of claim 1, wherein a first substrate supports an incoming and an outgoing electrode, and a second substrate supports a movable gate electrode.

10. The method of claim 1, wherein the incoming electrode, outgoing electrode and movable electrode each comprise a first metal layer and a second metal oxide layer deposited over the metal layer.

11. An electrical contact for a switch, comprising:
    a first layer of a first metal on a substrate; and
    a second layer of an oxide of a second metal, wherein the second layer of oxide of the second metal does not contain the first metal, and is disposed directly adjacent and in contact with the layer of the first metal, wherein the metal oxide is ruthenium dioxide at a thickness of between about 60 nm and about 120 nm.

12. The electrical contact of claim 11, wherein the substrate is a silicon substrate, and wherein the first metal layer is at least one of gold, copper, platinum, silver and aluminum, wherein the second metal is ruthenium and the metal oxide layer is ruthenium dioxide.

13. The electrical contact of claim 11, wherein the first metal layer is between about 0.5-5.0 um thick.

14. The electrical contact of claim 11, wherein the ruthenium dioxide is formed by sputter deposition of a ruthenium target in a low pressure oxygen environment.

15. The electrical contact of claim 11, wherein the switch is a MEMS switch.

16. The electrical contact of claim 14, wherein the oxygen environment has an oxygen partial pressure of about 0.5 mTorr to about 10 mTorr.

17. An electrical contact for a switch, comprising:
    a first metal layer of a first metal on a substrate; and
    a second layer of a second metal oxide, wherein the second metal oxide does not contain the first metal, and is disposed directly adjacent and in contact with the first metal layer,
    wherein the metal oxide is ruthenium dioxide at a thickness of between about 60 nm and about 120 nm.

18. The electrical contact of claim 11, wherein the switch is a dual substrate MEMS switch.

19. The electrical contact of claim 18, wherein a first substrate supports an incoming and an outgoing electrode, and a second substrate supports a movable gate electrode.

20. The electrical contact of claim 19, wherein the incoming electrode, outgoing electrode and movable electrode each comprise a first metal layer and a second metal oxide layer deposited over the metal layer.

* * * * *